United States Patent
Blanc et al.

(10) Patent No.: US 6,943,437 B2
(45) Date of Patent: Sep. 13, 2005

(54) SMART CARD OR SIMILAR ELECTRONIC DEVICE

(75) Inventors: René-Paul Blanc, Nans les Pins (FR); Jean-Christophe Fidalgo, Gémenos (FR); Philippe Patrice, Allauch (FR)

(73) Assignee: Gemplus, Gemenos Cedex (FR)

( * ) Notice: Subject to any disclaimer, the term of this patent is extended or adjusted under 35 U.S.C. 154(b) by 134 days.

(21) Appl. No.: 10/243,736

(22) Filed: Sep. 16, 2002

(65) Prior Publication Data

US 2003/0020182 A1 Jan. 30, 2003

Related U.S. Application Data

(63) Continuation of application No. 09/381,797, filed as application No. PCT/FR98/00592 on Mar. 25, 1998, now Pat. No. 6,468,835.

(30) Foreign Application Priority Data

Mar. 27, 1997 (FR) .......................................... 97/04093

(51) Int. Cl.[7] .............................................. H01L 23/02
(52) U.S. Cl. ...................... 257/679; 257/773; 257/786
(58) Field of Search ................................ 257/679, 688, 257/773, 776, 779, 786; 438/119

(56) References Cited

U.S. PATENT DOCUMENTS

5,690,773 A * 11/1997 Fidalgo et al. .............. 156/267
6,132,799 A    10/2000 Corniglion et al.

FOREIGN PATENT DOCUMENTS

| DE | 43 25 458 A | | 2/1995 |
| EP | 0 762 323 A2 | | 3/1997 |
| FR | 2624284 | * | 6/1989 |

* cited by examiner

Primary Examiner—Kevin M. Picardat
(74) Attorney, Agent, or Firm—Burns, Doane, Swecker & Mathis, L.L.P.

(57) ABSTRACT

The invention concerns an electronic device such as a smart card which includes at least a microcircuit embedded in a carrier medium and which includes exit hubs linked to interface elements composed of a terminal block and/or an antenna. The connections between the exit hubs and the interface elements are made by depositing a low-viscosity conducting substance which remains flexible after its application, using a syringe or similar device. Preferably, a polymer resin charged with conducting or intrinsically conducting particles is used for the connections.

16 Claims, 4 Drawing Sheets

SMART CARD OR SIMILAR ELECTRONIC DEVICE

This disclosure a continuation of U.S. application Ser. No. 09/381,797, filed Sep. 24, 1999 now U.S. Pat. No. 6,468,835 which was based upon, and claimed priority from, French Patent Application No. 97/04093, filed Mar. 27, 1997, and which was a national stage filing under 35 U.S.C. § 371 of International Application No. PCT/FR98/00592, filed Mar. 25, 1998, the contents of each of which are incorporated herein by reference.

FIELD OF THE INVENTION

The present invention concerns the making of electronic units including at least one microcircuit which is embedded in a carrier medium and linked to interface elements consisting of a terminal block and/or an antenna, such as integrated circuit cards with or without contacts, also known as smart cards. The invention also applies, in particular, to electronic labels which are used to identify products and which can be compared with smart cards without contacts. The present invention concerns more particularly the making of connections between the microcircuit and the interface elements, such as a terminal block and/or antenna.

BACKGROUND OF THE INVENTION

There are contact smart cards with interface terminal blocks, smart cards without contacts with an antenna housed in the carrier medium and hybrid cards or combicards which have an interface terminal block and an antenna.

There are numerous methods for making smart cards with contacts. Most of these methods are based on assembly of the chip in a sub-set called a micromodule which is assembled using traditional methods.

One method, illustrated in FIG. 1, involves first attaching the chip or microcircuit 20 ("die attach") which involves gluing a chip 20, cut from a board by sawing, arranging it with its active side having its exit hubs 22 facing upwards and by sticking the opposite side on a dielectric support plate 28, using a glue which could be conducting, the gluing being done on a printed circuit or film.

Then microcabling or soldering of connections is done ("wire bonding"), involving soldering the connection of the exit hubs 22 of the chip 20 with the terminal block of contacts 24 of the printed circuit plate. Then the case is coated ("potting"), involving protecting the chip 20 and the soldered connection wires 26 using a resin 30 which could be silicone or polyurethane based, for example.

In a variation of this method illustrated in FIG. 2, a peripheral metallic ring 32 is used around the resin 30 to make the micromodule more rigid.

In another variation of this method ("flip chip"), a chip with bumps or protuberances placed with the active side downward is used, the electrical connection being provided either by metallic or polymer bumps or by an anisotropic adhesive.

In other variations, tape automated bonding (TAB) is used, as illustrated in FIG. 3, according to which the chip 34 is glued using an anisotropic glue 36 and the various contacts of the film 38 are soldered by thermocompression on the chip 34 which has bumps 39.

There are also methods for making smart cards with contacts without using micromodules. One method is based on using screen printing to form contacts and to provide chip interconnections.

Another method involves metallization in three dimensions of the body of the card, followed by transfer of the chip using classic technology (gluing plus microcabling) or by the "flip chip" technique described above.

In the methods which use a micromodule, the associated costs are limited by the price of the film. In addition, it is often necessary, after the encapsulation operation, to mill the resin to reduce the thickness of the unit. This operation is difficult because the resin is polymerized and thus very rigid. The milling is the main cause of production rejects.

In the first method without micromodules described above, this resin is on the surface and thus subject to exterior stresses, greatly increasing the associated cost. For the second method without micromodules the number of steps is high, which also increases the cost.

This technology would therefore not be suitable for making large chip cards.

There are two large families of methods for making smart cards without contacts. The first uses a wound antenna which is either soldered on a micromodule containing the chip, or directly on a chip with bumps. Such a technique can only be used for chips with simple operation.

The second family uses a "flat" antenna which can be in the form of a rectangular peripheral spiral or any other appropriate form. Such an antenna can be made by photogravure, mechanical cutting, stamp printing, screen printing, or offset printing with a conducting ink. The chip is then transferred to the antenna using the "flip-chip" technique or a classic technique.

In these methods for making smart cards without contacts, micromodule manufacturing is used which, as mentioned above, involves numerous steps for assembling the chip and implies substantial costs, or the "flipchip" technique for which the pace is limited and the installation costs particularly high.

The methods for hybrid smart cards combine the disadvantages previously mentioned for smart cards both with and without contacts.

SUMMARY

The basic purpose of the invention is to provide a method for making connections between a microcircuit and the interface elements in an electronic unit (such as a smart card) including at least one microcircuit which is embedded in a carrier medium and which includes exit hubs linked to interface elements including a terminal block and/or an antenna which do not have the above-mentioned disadvantages and which make it possible in particular to reduce the cost and percentage of production rejects without making micromodules.

The method according to the invention involves depositing, using a syringe or similar device, of a drop of a low-viscosity conducting substance between each exit hub and the corresponding interface element, the conducting substance acting by polymerization, including conducting charges and remaining flexible after polymerization.

This method makes it possible to eliminate the making of micromodules and to reduce the number of production steps.

In addition, flexible connections are obtained whereas the connections of the known type are rigid or semi-rigid, and this sharply reduces the rate of production rejects.

Advantageously, the terminal block is also made by depositing a low-viscosity conducting substance. This makes it possible to further simplify the method with the making of the terminal block and its connections in a single operation.

Advantageously, the antenna is also made by depositing a low-viscosity conducting substance. This makes it possible to simplify the production and to improve the antenna performance.

The substance should preferably be a polymer resin charged with conducting or intrinsically conducting particles.

BRIEF DESCRIPTION OF THE DRAWINGS

Other characteristics and advantages of the invention will appear with the reading of the detailed description which follows. These will be more clearly understood by consulting the appended drawings in which.

DETAILED DESCRIPTION

Figure 1:
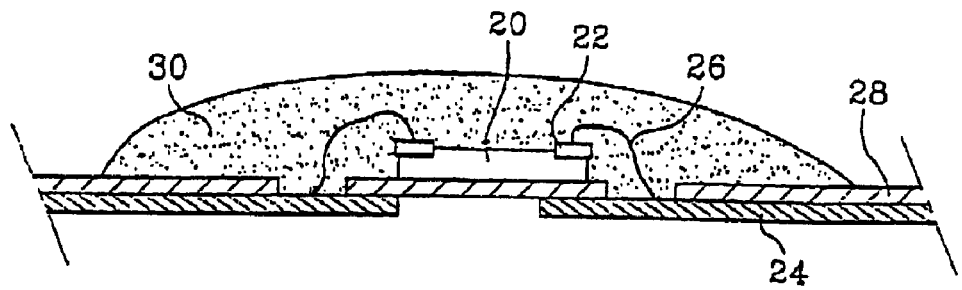
FIG. 1 is a cross-section diagram which illustrates a known method for making smart cards with contacts.
Figure 2:
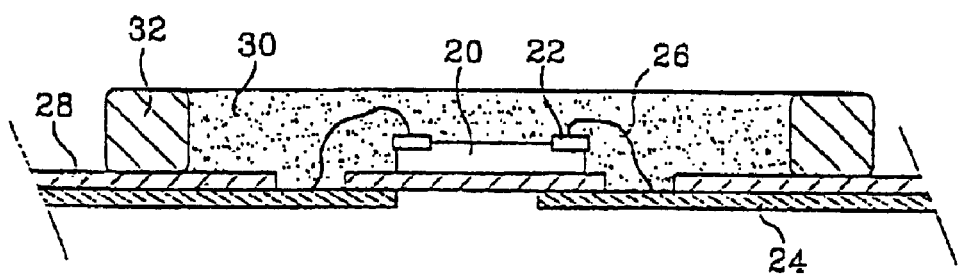
FIG. 2 illustrates a variation of the method shown in FIG. 1.
Figure 3:
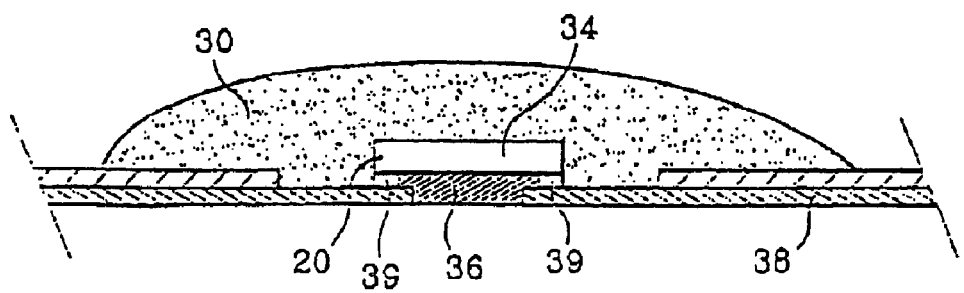
FIG. 3 illustrates another variation of the method shown in FIG. 1.
Figure 4:
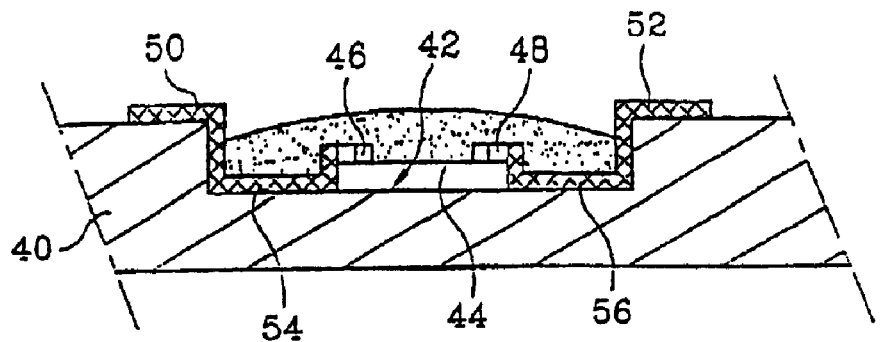
FIG. 4 illustrates a system for the method based on the invention applied to the making of smart cards with contacts.

FIG. 4 shows a smart card with contacts made according to a method of the present invention. Initially, a card body 40 is made which includes a cavity 42 which can be made by injection molding or by colamination of thermoplastic sheets followed by machining of the cavity.

In a second step, the chip 44 is placed in the cavity with its active side, and particularly its exit hubs 46 and 48, facing upwards, and it is attached by gluing, for example. Local heating of the cavity can also be done followed by placing the chip in the molten thermoplastic material. The active side of the chip does not have to be on the same level as the bottom of the cavity.

In a third step, the contact terminal block and the connections with the exit hubs 46 and 48 are made by depositing a low-viscosity conducting substance, for example a polymer resin charged with conducting or intrinsically conducting particles, by a technique called "dispensing" by which a liquid or low-viscosity substance is applied using a syringe or similar such device with controlled outflow and opening, which is moved relative to the chip and body, or vice versa. This depositing operation, hereafter referred to as dispensing, is done for example using a commercially-available unit called CAM/ALOT made by the American company Camelot Systems Inc. and used for on-line production of electronic circuits. The movement and opening of the syringe is controlled by a computer program.

The conducting resin is thus deposited, making the contacts 50 and 52 of the interface terminal block of the smart card and connections 54 and 56 between the contacts 50 and 52 and the exit hubs 46 and 48 of the chip. The thickness of these deposits can be much greater than by a screen printing method, allowing for larger sections and thus low contact resistance.

Advantageously, the exit hubs 46 and 48 include non-oxidizable metal such as nickel, titanium or tungsten. These hubs can also have bumps in order to improve the electrical contact.

To correct chip positioning errors, regulation using an image of the chip provided by a computer visualizing system can be used.

Resins with an activation temperature which is below the temperature of softening of the thermoplastic material of the card body should preferably be used.

Figure 5:
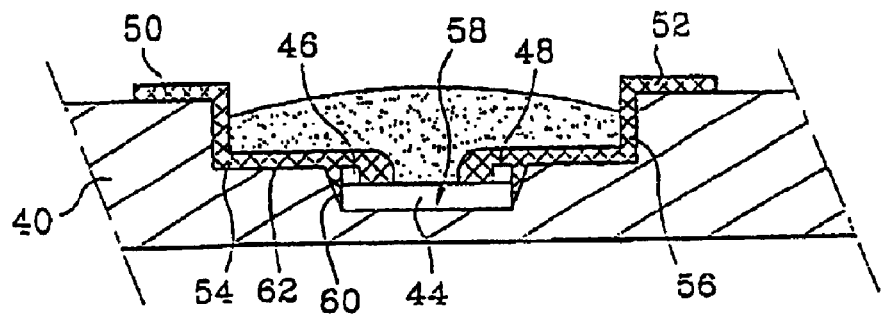
FIG. 5 illustrates a variation of the method shown in FIG. 4.

FIG. 5 illustrates a variation of the previously mentioned method in which a two-level cavity is made, i.e. a cavity 58 with a recess 60 at its bottom. The dimensions of this recess are sufficient for it to receive the chip 44 and its depth is essentially the same as the thickness of the chip so that its active side is at the bottom level 52 of the cavity 58. This arrangement avoids a second change of slope of the resin cords in the cavity, which facilitates contact of the conducting resin with the exit hubs 46 and 48.

In the fourth and final step, an encapsulation (potting) is done which involves protecting the chip by using a resin, for example a silicone or polyurethane based resin.

Figure 6:
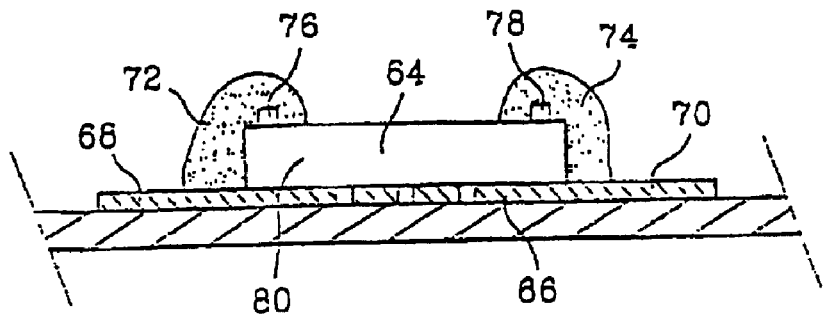
FIG. 6 illustrates a system applied to the making of smart cards without contacts.
Figure 7:
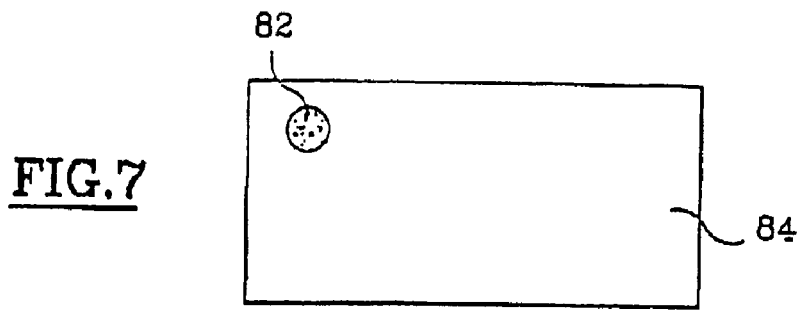
FIGS. 7 to 10 illustrate a variation of the method shown in FIG. 6.
Figure 8:
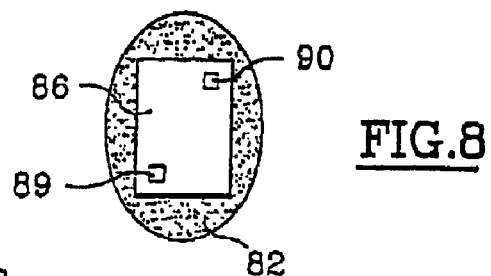
Figure 9:
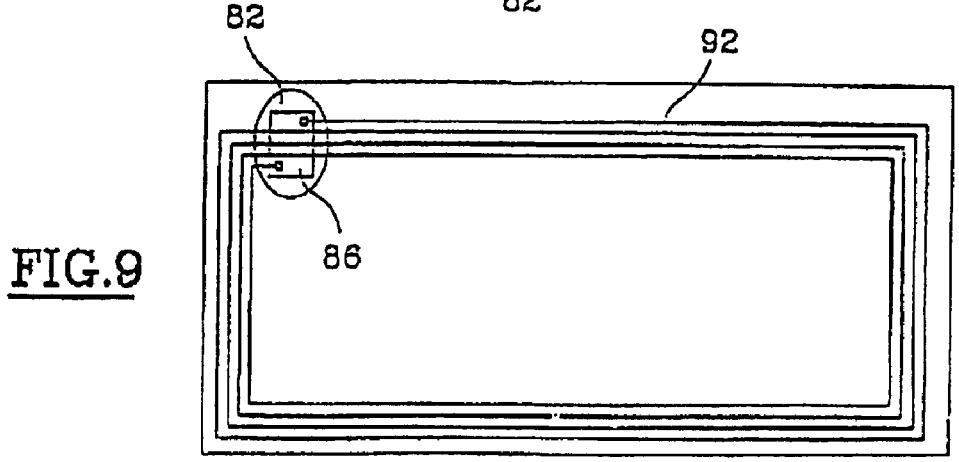

FIG. 6 shows a smart card without contacts made according to the method of the invention. It includes a "flat" antenna made of a track in, for example, the form of a rectangular spiral arranged on the periphery of the card as shown in FIG. 9.

In a first step, a chip 64 is glued with its active side facing up at the place chosen for the connection using a classic "die attach" method and equipment and using a glue 66 which allows for gluing on a printed circuit or film. A glue is chosen which is compatible with the maximum use temperature of the antenna support, for example an adhesive which reticulates when exposed to ultraviolet rays. The pace of this gluing operation may be very high, for example five to six thousand pieces per hour with a single head. It is important that the bead of glue be perfectly controlled in the perimeter of the chip located facing the antenna connection areas 68 and 70.

In a second step, the electrical connections 72 and 74 are made with a conducting resin between the exit hubs 76 and 78 of the chip 80 and the connection areas 68 and 70 of the antenna. This second step can also be done at the same fast pace as the chip gluing step. These two steps can be done with the same equipment.

According to one variation, the flat antenna is made with a "dispensing" technique and the gluing of the chip is done by the "flip chip" technique described above.

According to another variation illustrated in FIGS. 7 to 10, the chip is first glued and then the antenna is made using a "dispensing" technique on the active side of the chip.

In the first step (FIG. 7), an insulating adhesive 82 (epoxy type for example) is dispensed onto a support 84 (vinyl polychloride or polyethylene for example) at the place where the chip with the contact bumps will then be attached. Adhesives for the "die attach" technique adapted to the support can be used for this step.

In a second step (FIG. 8), a chip 86 is set with its active side facing upwards on the adhesive 82 for a "die attach" type gluing. The contact bumps improve the electrical contact between the exit hubs 88 and 90 of the chip and the antenna. The non-operational exit hubs may be insulated by applying a dielectric varnish.

In a third step (FIG. 9), the antenna 92 is applied by the technique of dispensing a conducting substance, for example an ink or glue, with movement of the syringe using, for example, the CAM/ALOT equipment mentioned above.

Figure 10:
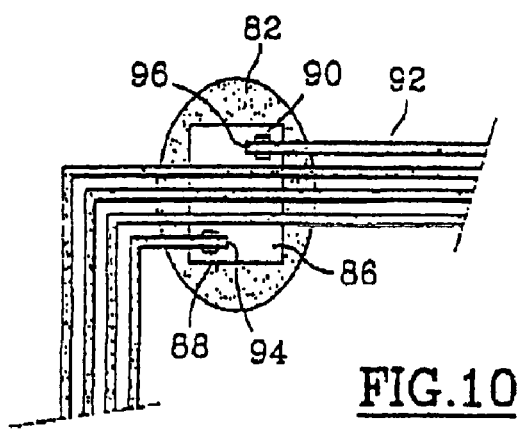

FIG. 10 shows that the extremities 94 and 96 of the rectangular spiral which makes up the antenna 92 cover the contact hubs 88 and 90 of the chip 86, respectively.

In the fourth and final step, colamination is done to finish the card.

Figure 11:
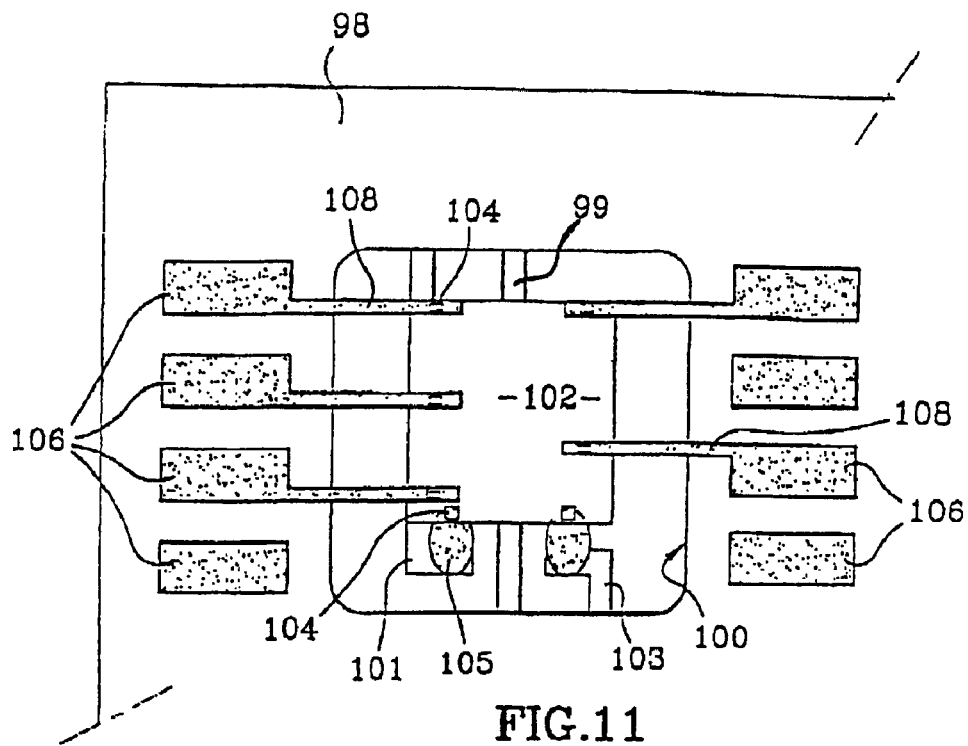
FIG. 11 illustrates a system applied to the making of hybrid smart cards.

FIG. 11 shows a hybrid smart card made by a method based on the invention. In this case, the two previously described methods are combined. In a first step, the card body 98 is made including an incorporated antenna 99 having two contact hubs 101 and 103. In a second step, a cavity 100 is made in the body of the card. In a third step, the chip 102 is attached with its active side and its exit hubs 104, which preferably include non-oxidizable metal plating, in the cavity, by gluing for example.

In a fourth step, the contact terminal block 106 and its connections 108 with the exit hubs 104 of the chip and its connections 105 of the contact hubs 101 and 103 of the antenna with the exit hubs 104 are made by depositing a conducting resin 105 by a dispensing technique. The hubs 104 can include contact bumps.

The angular positioning errors of the chip 102 can be corrected as described above by using computer visualizing equipment.

In the fifth and final step, the encapsulation of the chip is carried out.

Figure 12:
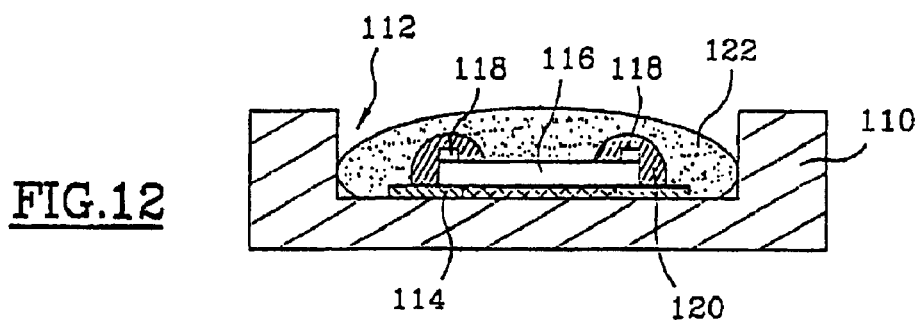
FIGS. 12 and 13 illustrate a system applied to the making of electronic labels.
Figure 13:
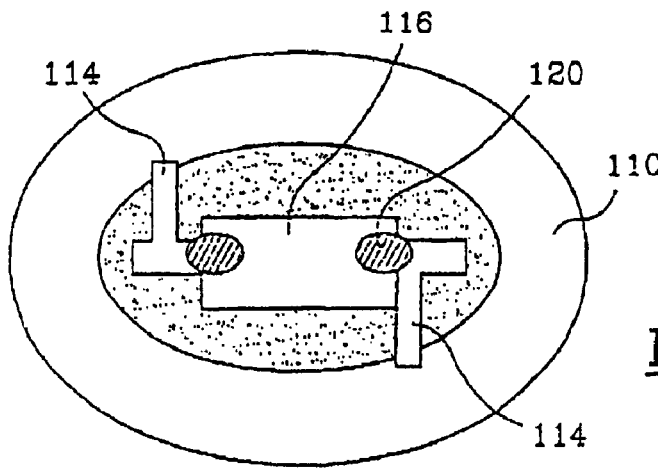

The invention applies to the production of all electronic devices which have at least one microcircuit which is embedded in a carrier medium and which includes exit hubs linked to interface elements including a terminal block and/or an antenna. In particular, the invention allows for manufacturing of electronic labels as shown in FIGS. 12 and 13.

A support 110 includes a cavity 112 at the bottom of which an antenna 114 is installed. A microcircuit 116 is then attached here with its exit hubs 118 facing upwards. A conducting resin 120 is applied by a dispensing technique to make the connections between the antenna 114 and the exit hubs 116 of the chip. Encapsulation is then done using an insulating resin 122.

The invention makes it possible to eliminate the making of a micromodule and particularly the milling operation. The rate of production rejects is thus greatly reduced. The number of steps is also reduced, greatly simplifying the production and substantially reducing the cost price. These factors are further enhanced by the fact that some of the chip gluing and connection making operations can be done with the same equipment.

The invention does not use costly equipment, thereby reducing production costs.

The making of the antenna by the dispensing technique yields a maximum area, thereby improving antenna performance with respect to the classic incorporated wound antennae.

The invention allows for making complex and large cards in a simple and economical way.

The making of connections using the technique of "dispensing" a substance which remains flexible after its activation reduces rigidity and considerably increases the smart cards' resistance to bending-torsion. Smart cards made according to the method of the invention have much higher resistance to stress than that required by the current standards.

As indicated above, the invention allows for very high production rates, on the order of 4000 smart cards per hour for example, with a very low reject rate.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalents thereof are intended to be embraced therein.

What is claimed is:

1. An electronic device comprising:
   at least one interface element composed of a terminal block with contacts and/or an antenna;
   a microcircuit embedded in a carrier medium and having exit hubs; and
   connections between the exit hubs and the interface elements that are formed by a low-viscosity conductive substance which remains flexible after application and polymerization.

2. An electronic device according to claim 1, wherein the interface element includes a terminal block, and the terminal block comprises said low-viscosity conductive substance.

3. An electronic device according to claim 1, wherein the interface element includes an antenna, and antenna comprises said low-viscosity conductive substance.

4. An electronic device according claim 1, wherein the conductive substance is a polymer resin containing conductive particles.

5. An electronic device according to claim 1, wherein the conductive substance is a polymer resin containing intrinsically conductive particles.

6. An electronic device according to claim 4, wherein the carrier medium comprises a thermoplastic material,
   and wherein an activation temperature of the conductive substance is lower than a melting point of the thermoplastic material.

7. An electronic device according to claim 1, wherein the exit hubs have a rust-resistant metallization.

8. An electronic device according to claim 2, wherein
   the carrier medium has a cavity,
   the interface element comprises a terminal block with contacts,
   the microcircuit is fixed with its active face upwards in the cavity,
   the terminal block and the connections comprise said low-viscosity conductive substance, and
   the microcircuit is encapsulated.

9. An electronic device according to claim 8, wherein the microcircuit has contact bumps.

10. An electronic device according to claim 8, wherein the cavity has a recess at its bottom adapted to receive the microcircuit.

11. An electronic device according to claim 1,
   wherein electronic device is a contactless chip card or an electronic label,
   the interface element is a flat antenna,
   the microcircuit is attached to the carrier medium with an active face of the microcircuit facing upwards, and
   the connections between the exit hubs of the microcircuit and the hubs of the flat antenna comprise said low-viscosity conductive substance.

12. An electronic device according to claim 1,
wherein electronic device is a contactless smart card or an electronic label,
the interface element comprises a flat antenna formed from said low-viscosity conductive substance,
the microcircuit has contact bumps, and
the microcircuit is attached to the carrier medium with an active face of the microcircuit facing downward.

13. An electronic device according to claim 1, comprising:
an insulating adhesive disposed on the carrier medium, and
a flat antenna formed on the microcircuit by said low-viscosity conductive substance,
wherein the microcircuit is attached to the carrier medium with an active face of the microcircuit facing upward, and
wherein the electronic device is co-laminated.

14. An electronic device according to claim 2, wherein
the electronic device is a hybrid card having a terminal block and having an antenna incorporated in the carrier medium,
the carrier medium has a cavity,
the microcircuit is attached in the cavity with an active face of the microcircuit facing upward,
the terminal block and the connections comprise said low-viscosity conductive substance, and
the microcircuit is encapsulated.

15. An electronic device according to claim 14, wherein the microcircuit has contact bumps.

16. An electronic device comprising:
at least one interface element composed of a terminal block with contacts and/or an antenna;
a microcircuit embedded in carrier medium and having exit hubs linked to the interface elements;
wherein connections between the exit hubs and the interface elements comprise a conductive substance which remains flexible after application and polymerization, the conductive substance having low-viscosity when the connections are formed.

* * * * *